(12) United States Patent
Boerstler et al.

(10) Patent No.: US 7,279,996 B2
(45) Date of Patent: Oct. 9, 2007

(54) METHOD OF FUNCTIONALITY TESTING FOR A RING OSCILLATOR

(75) Inventors: David William Boerstler, Round Rock, TX (US); Eskinder Hailu, Austin, TX (US); Harm Peter Hofstee, Austin, TX (US); John Samuel Liberty, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/204,408

(22) Filed: Aug. 16, 2005

(65) Prior Publication Data

US 2007/0040620 A1    Feb. 22, 2007

(51) Int. Cl.
*H03K 3/03* (2006.01)
(52) U.S. Cl. .................. 331/57; 331/44; 324/527; 257/48
(58) Field of Classification Search .............. 331/57, 331/44; 324/527; 257/48
See application file for complete search history.

(56) References Cited

U.S. PATENT DOCUMENTS 5,430,394 A * 7/1995 McMinn et al. ............ 327/292
6,958,659 B2 * 10/2005 Nakajima .................... 331/57

OTHER PUBLICATIONS

Boerstler et al. Oscillator Array with Row and Column Control, Mar. 31, 2005.

* cited by examiner

*Primary Examiner*—Robert Pascal
*Assistant Examiner*—Levi Gannon
(74) *Attorney, Agent, or Firm*—Duke W. Yee; D'Ann N. Rifai; James O. Skarsten

(57) ABSTRACT

A method and apparatus is provided for testing the logic functionality and electrical continuity of a ring oscillator comprising an odd number of inverters connected to form a closed loop. In the method and apparatus, a known value is forced through the ring oscillator, to test the complete circuit path thereof. Thus, a low overhead deterministic test of the functionality of the ring oscillator is provided. In a useful embodiment of the invention, a method is provided for testing functionality and electrical continuity in a ring oscillator, wherein a first test device is inserted between the input of a first inverter and the output of an adjacent second inverter. The first test device is then operated to apply first and second test bits as input test signals to the first inverter input. The embodiment further comprises detecting the response to the applied first and second test bit signals at the output of the second inverter, and using the detected responses in providing an evaluation of functionality of the ring oscillator.

18 Claims, 3 Drawing Sheets

| | MODES | MUX A SELECT | MUX B SELECT | MUX C SELECT | VALUE AT SAMPLE-REG |
|---|---|---|---|---|---|
| a | NORMAL OPERATION | T0 | T0 | T0 | X |
| b | TEST 1 | T0 | T1 | T0 | 0 |
| c | TEST 2 | T0 | T2 | T0 | 1 |
| d | TEST 3 | T1 | T0 | T1 | 0 |
| e | TEST 4 | T2 | T0 | T1 | 1 |

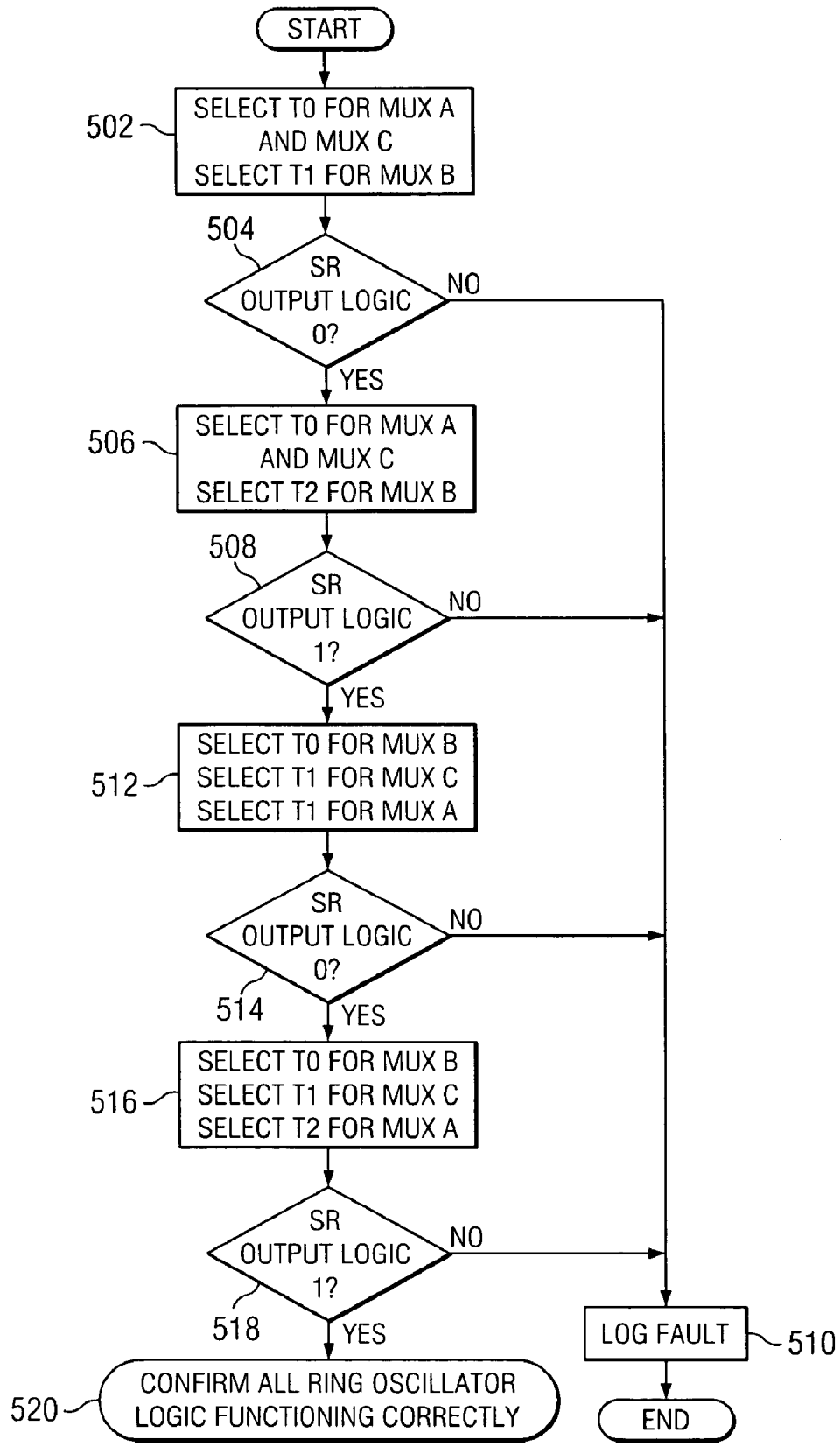

METHOD OF FUNCTIONALITY TESTING FOR A RING OSCILLATOR

BACKGROUND OF THE INVENTION

1. Field of the Invention

The invention disclosed and claimed herein generally pertains to a method for testing logic functionality of a ring oscillator, following its manufacture, wherein the ring oscillator comprises an odd number of inverters. More particularly, the invention pertains to a method of the above type for quickly and efficiently determining the functionality and electrical continuity of every oscillator component, and of the interconnections therebetween. Even more particularly, the invention pertains to a method of the above type for testing each ring oscillator in a group of such oscillators that are interconnected to form a random number generator.

2. Description of the Related Art

As is well known by those of skill in the art, a ring oscillator may be constructed or fabricated by connecting an odd number of inverter gain stages to form a closed loop. In order to start the oscillator, the total loop gain must be greater than 1. Ring oscillators can be used for a variety of applications that are generally well known to those of skill in the art. Moreover, it has now been recognized that a group of ring oscillators can be selectively interconnected, to provide a truly random number generator. A generator of this type provides a true numerical value that cannot be determined by reverse engineering or other means. This is very significant, since there is an increasing need in data processing for a random number generator that does not rely on pseudo-random techniques. Such techniques tend to be deterministic, discoverable and not sufficiently random.

In one very useful configuration, a random number generator (RNG) of the above type comprises in excess of 60 separate ring oscillators, which are collectively operated to generate a random number. All of the ring oscillators may be fabricated on a single chip. Accordingly, after manufacture of the chip containing the RNG circuit, the RNG logic needs to be tested, in order to show its functionality. The initial test would be to show electrical continuity through each of the oscillator circuits, that is, that an electrical current flows through each component of a ring oscillator, and through interconnections therebetween. However, since the circuit by definition is an oscillator, just sampling the output of the oscillator does not show that it is functional, since the output is non-deterministic.

One approach to test ring oscillators used in the above RNG design would be to bring the output of each individual oscillator to external pins. However, this could be very expensive in terms of the chip global wiring and logic that would be required for the total number of different oscillators included in the generator.

Another approach in manufacturing testing would be to load a test program into a processor connected to the ring oscillators. This program could read the RNG multiple times, and sense that the respective ring oscillators were switching. This testing approach could infer general operation of the RNG. However, due to the random nature of the output values of the RNG, it statistically could be necessary to have a large number of samples for any particular bit to be read both as a 1 and as a 0. Moreover, given the 60 or more oscillators in the RNG design, the program would have to make a very large number of samples in order to determine full functionality. Also, manufacturing test programs running on the chip and on an IC chip tester tend to have a high overhead in terms of time and resources, and are thus less desirable than an integrated logic approach.

SUMMARY OF THE INVENTION

The invention generally provides a method for testing the logic functionality and electrical continuity of a ring oscillator comprising an odd number of inverters connected to form a closed loop. As is known, an inverter is a logic gate, wherein application of one digital logic state to the inverter input drives the inverter output to the opposite logic state. As used herein, the term "electrical continuity" refers to the condition whereby an electric current is able to flow as intended through each electrical path provided in the ring oscillator, including paths through each inverter, and also through respective connections therebetween. In one useful embodiment of the invention, a method is provided for testing electrical continuity and other functionality in a ring oscillator of the type described above. The method includes the step of inserting a first test device between the input of a first inverter and the output of an adjacent second inverter. The first test device is then operated to apply first and second test bits as input test signals to the first inverter input. The method further comprises detecting the response to the applied first and second test bits at the output of the second inverter, and using the detected response in providing an evaluation of the logic functionality of the ring oscillator. Thus, the method forces a known value through the ring oscillator, to test the complete circuit path. This provides a low overhead, deterministic test of ring oscillator functionality.

BRIEF DESCRIPTION OF THE DRAWINGS

FIG. 5 is a flow chart showing respective process steps for an embodiment of the invention.

DETAILED DESCRIPTION OF THE PREFERRED EMBODIMENT

Figures 1, 3:
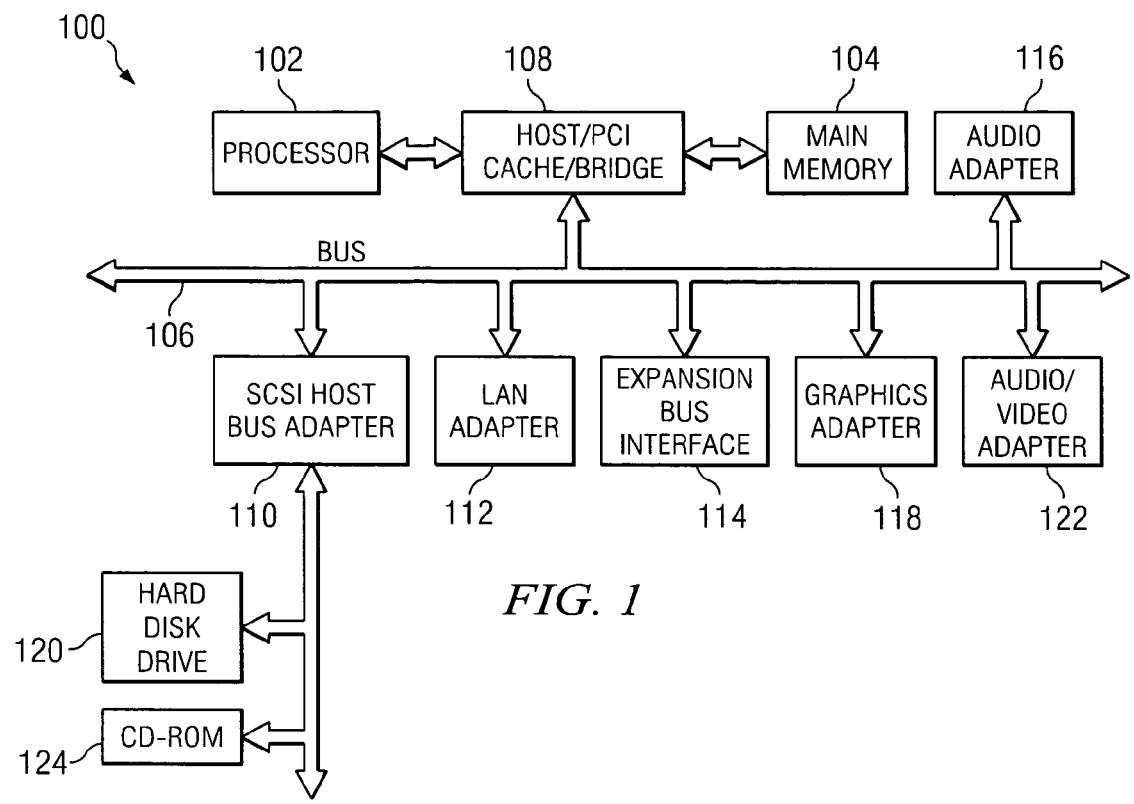
FIG. 1 is a block diagram showing a data processing system for use in implementing an embodiment of the invention.
FIG. 3 is a table showing information pertaining to a testing procedure for an embodiment of the invention.

Referring to FIG. 1, there is shown a block diagram of a generalized data processing system 100 which may be used in implementing embodiments of the present invention. Data processing system 100 exemplifies a computer, in which code or instructions for implementing the processes of the present invention may be located. Data processing system 100 usefully employs a peripheral component interconnect (PCI) local bus architecture, although other bus architectures such as Accelerated Graphics Port (AGP) and Industry Standard Architecture (ISA) may alternatively be used. FIG. 1 shows a processor 102 and main memory 104 connected to a PCI local bus 106 through a Host/PCI bridge 108. PCI bridge 108 also may include an integrated memory controller and cache memory for processor 102.

Referring further to FIG. 1, there is shown a local area network (LAN) adapter 112, a small computer system interface (SCSI) host bus adapter 110, and an expansion bus interface 114 respectively connected to PCI local bus 106 by direct component connection. Audio adapter 116, a graphics adapter 118, and audio/video adapter 122 are connected to PCI local bus 106 by means of add-in boards inserted into expansion slots. SCSI host bus adapter 110 provides a connection for hard disk drive 120, and also for CD-ROM drive 124.

An operating system runs on processor 102 and is used to coordinate and provide control of various components within data processing system 100 shown in FIG. 1. The operating system may be a commercially available operating system such as Windows XP, which is available from Microsoft Corporation. Instructions for the operating system and for applications or programs are located on storage devices, such as hard disk drive 120, and may be loaded into main memory 104 for execution by processor 102.

Figure 2:
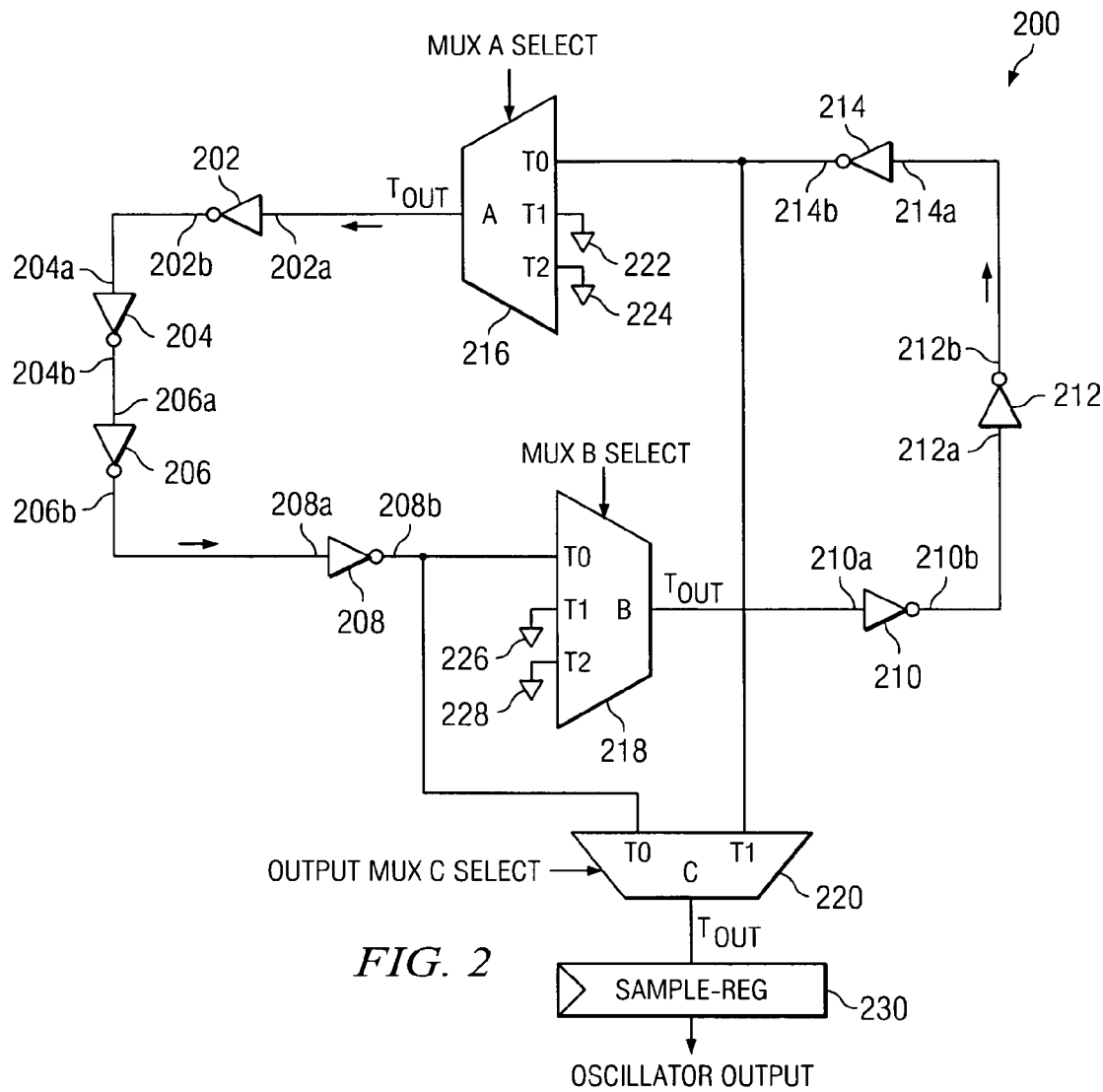
FIG. 2 is a schematic diagram showing a ring oscillator and related test components constructed in accordance with an embodiment of the invention.

Referring to FIG. 2, there is shown a ring oscillator 200 comprising inverters 202-214. Each inverter has an input terminal, or input, and an output terminal, or output, such as input 202$a$ and output 202$b$ of inverter 202. As described above, if one of the inverters 202-214 receives a digital logic value of 0 or 1 at its input, its output will go to the opposite value, that is to logic 1 or logic 0, respectively. Moreover, inverters 202-214 are interconnected to form a closed loop. More particularly, the output of an inverter is connected to the input of the next following inverter, in proceeding around the loop. Thus, the output 202$b$ of inverter 202 is connected to the input 204$a$ of inverter 204, the output 204$b$ of inverter 204 is connected to input 206$a$, and so on around ring oscillator 200. While FIG. 2 shows ring oscillator 200 comprising 7 inverters, a different odd number of inverters could alternatively be used.

By providing the arrangement of FIG. 2, a digital bit of one state applied as the input signal to a particular inverter will be inverted by each successive inverter, until it reaches the final inverter in going around the loop. The output signal of such final inverter will be of an opposite state from the initial input signal. As stated above, a substantial number of ring oscillators of the type shown in FIG. 2 can be configured together, in order to construct a truly random number generator. Accordingly, it is important to provide a technique mud associated means for quickly and efficiently testing the logic functionality of each oscillator 200 and the electrical continuity thereof.

In order to achieve this objective, FIG. 2 further shows two multiplexer devices 216 and 218, also referenced as multiplexers A and B, respectively, having input and output terminals connected to ring oscillator 200. More particularly, multiplexer 216 has a single output terminal $T_{out}$ and three input terminals, respectively represented as terminals T0, T1, and T2. Multiplexer 218 likewise has an output terminal $T_{out}$ and input terminals T0, T1, and T2.

It is to be understood that multiplexers 216 and 218 are constructed to be permanent and integral components of ring oscillator 200. The input terminal T0 of multiplexer device 216 is coupled to inverter output 214$b$, and the output of multiplexer 216 is connected to inverter input 202$a$. In similar manner, input T0 of multiplexer 218 is connected to inverter output 208$b$, and the output of multiplexer 218 is connected to inverter input 210$a$.

FIG. 2 further shows multiplexers 216 and 218 receiving multiplexer A and B select signals, respectively. Each received select signal directs the corresponding multiplexer to receive an input through a specified one of its three input terminals, and to couple the received input to its output $T_{out}$. Thus, operation of the multiplexers is controlled by respective select signals.

Referring further to FIG. 2 in view of the above, it will be understood that if a multiplexer A select signal specifies input T0 of multiplexer 216, inverter output 214$b$ will be coupled through multiplexer 216 from T0 to the $T_{out}$ terminal thereof. On the other hand, if the multiplexer A select signal designates input T1 or T2, component 222 or 224, respectively, will be coupled to the multiplexer 216 output. Component 222 always provides a logic 1, and component 224 always provides a logic 0. In similar manner, the output of multiplexer 218 will be coupled either to inverter output 208$b$, to a component 226 or to a component 228, according to whether the multiplexer B select signal designates input terminal T0, T1 or T2, respectively. Components 226 and 228 always provide a logic 1 and a logic 0, respectively.

Referring further to FIG. 2, there is shown a multiplexer 220, which is similar to multiplexers 216 and 218 and operates in substantially the same way. Multiplexer 220 is also constructed as an integral component of ring oscillator 200, and is alternatively referenced as multiplexer C. Multiplexer 220 is shown to have only two input terminals T0 and T1. An input value connected to one of these inputs, as designated by a multiplexer C select signal, will be coupled to the output terminal $T_{out}$ of multiplexer 220. Input T0 of device 220 is connected to inverter output 208$b$ and also to terminal T0 of multiplexer 218. Input T1 of multiplexer 220 is similarly connected to the inverter output 214$b$ and also to terminal T0 of multiplexer 216.

FIG. 2 further shows the output $T_{out}$ of multiplexer 220 connected to a sample register 230, which provides the output of ring oscillator 200. This output may include the results of tests conducted to evaluate the functionality and electrical continuity of ring oscillator components, as further described hereinafter.

The multiplexer A, B and C select signals can be global select signals. Referring to FIG. 3, there are shown different settings of the multiplexers, made in response to their respective multiplexer select signals, for different operational or test modes (a)-(e). There is also shown the oscillator output value provided by sample register 230 for each of the modes and multiplexer settings.

In mode (a), the ring oscillator 200 is running in a normal or non-test mode of operation. In this mode, multiplexer A and B select signals direct multiplexers 216 and 218 to connect their T0 inputs to their respective outputs. Accordingly, in normal running mode, inverter output 214$b$ is connected directly to inverter input 202$a$, and inverter output 208$b$ is directly connected to inverter input 210$a$. It will thus be seen that the presence of multiplexer devices 216 and 218 has no effect on the normal operation of ring oscillator 200, even though they are permanent and integral components of the oscillator. The multiplexer C select signal connects input T0 of multiplexer 220 to the output thereof, so that the output value of shift register 230 will be the output value of inverter 208. For normal operation of ring oscillator 200, this output value will be indeterminate, and is thus represented in FIG. 3 as "X".

As an important feature of the invention, it has been recognized that only four settings of the multiplexers are required, in order to provide complete coverage in testing for faults in ring oscillator 200. Accordingly, the modes (b)-(e) shown in FIG. 3 are directed to the respective multiplexer settings required for four sequential fault detection tests 1-4.

Referring specifically to test 1, FIG. 3 shows that multiplexers 216 and 220 are set to receive inputs through their T0 terminals. Accordingly, the output value of multiplexer 220 and the output value at register 230 will be the output value of inverter 208. Moreover, multiplexer 218 receives its input from its T1 terminal, and thus receives a logic 1 value from component 226. The effect of this is to force the output $T_{out}$ of multiplexer 218 to logic 1. In view of the respective multiplexer connections for test 1, if all logic in ring oscillator 200 is functioning correctly, then a value of logic 0 would be observed at inverter output 208b, and therefore at the output of register 230.

Referring further to FIG. 3, it is seen that for test 2, multiplexers 216 and 220 again receive inputs through their respective T0 terminals. Multiplexer 218 is directed by the multiplexer B select signal to receive its input from T2, which is tied to component 228 held to logic 0. Thus, for test 2 the output of multiplexer 218 is forced to logic 0. If all logic in oscillator 200 is functioning correctly, then a value of logic 1 would be observed at the output of inverter 230.

It is to be understood that tests 1 and 2 cover all circuits in the oscillator except for any circuits within multiplexer 218, between the inputs and the output thereof. Tests 3 and 4 shown in FIG. 3 are provided to cover these circuits. For both tests 3 and 4, multiplexer 218 is set to receive inputs through its T0 terminal, and multiplexer 220 is set to receive inputs through its T1 terminal. Thus, the output of register 230 is tied to the output of inverter 214.

For test 3, multiplexer 216 is set to receive an input through its terminal T1, and is thus tied to the logic 1 of component 222. This forces the output of multiplexer 216 to logic 1, so that a logic 0 is observed at the register 230 output, if all circuits in multiplexer 218 are functioning correctly (assuming that tests 1 and 2 have already established the correct functioning of other ring oscillator components). For test 4, multiplexer 216 is set to receive its input from terminal T2, tied to logic 0, thereby forcing the multiplexer 216 output to logic 0. A logic 1 should then be observed at register 230, to confirm the correct functionality of multiplexer 218.

Figure 4:
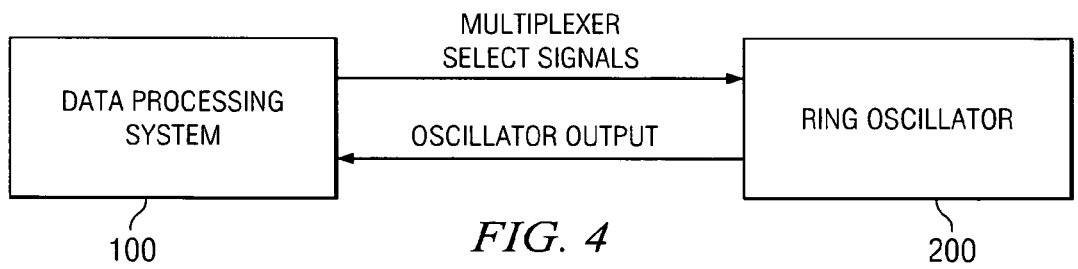
FIG. 4 is a block diagram showing the data processing system of FIG. 1 and the ring oscillator of FIG. 2 interconnected to implement an embodiment of the invention.

Referring to FIG. 4, there is shown data processing system 100 coupled to supply respective multiplexer A, B and C select signals to ring oscillator 200, to selectively operate the multiplexers as described above. Data processing system 100 also receives the oscillator outputs from register 230, in response to each of the tests 1-4. System 100 is configured to process the received test results, to provide an evaluation of the functionality of ring oscillator 200.

Referring to FIG. 5, there is shown a flow chart depicting steps in a procedure following tests 1-4, as described above. When the procedure is started, function block 502 indicates that input T0 is selected for multiplexers 216 and 220, and T1 is selected for multiplexer 218, in accordance with test 1. As indicated by decision block 504, the output of sample register 230 is then observed, to see if it has a value of logic 0 or logic 1. If it is logic 0, function block 506 and decision block 508 indicate that the inputs of respective multiplexers are to be set in accordance with test 2, and the register output is checked for a logic 1. However, a register 230 output of logic 1 indicates that there is a fault in the ring oscillator. The fault is logged and the procedure is ended, as shown by function block 510.

In similar manner, function block 512 and decision block 514 depict execution of test 3. Function block 516 and decision block 518 depict execution of test 4. As indicated by function block 520, if the sample register output is at logic 1 upon the execution of test 4, a confirmation will be provided stating that all ring oscillator logic is functioning correctly. Such confirmation could comprise the evaluation provided by data processing system 100.

It is important to note that while the present invention has been described in the context of a fully functioning data processing system, those of ordinary skill in the art will appreciate that processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, and wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing functionality in a ring oscillator that comprises an odd number of inverters connected to form a closed loop, each inverter having an input and an output wherein the output of an inverter is connected to the input of the next inverter in proceeding around the loop, said method comprising the steps of:

inserting a first test device between the input of a first inverter and the output of an adjacent second inverter;

operating said first test device to apply first and second test bits as input test signals to said first inverter input;

detecting the response to said applied first and second test bits at said output of said second inverter;

using the detected response in evaluating the functionality of said ring oscillator;

operating a second test device connected to said ring oscillator to provide further test bits for use in determining functionality of said first test device; and connecting a third test device to receive said response to said first and second test bit signals as a first input, and to receive the response to said further test bits as a second input, said first and second inputs to said third device collectively comprising a ring oscillator output for use in evaluating the functionality of said ring oscillator.

2. The method of claim 1 wherein:

said first, second and third test devices are respectively connected to said ring oscillator as integral components thereof.

3. The method of claim 2, wherein:

corresponding select signals are coupled to said first, second and third test devices, to respectively control operations thereof.

4. The method of claim 3, wherein:

said second test device is inserted between the input of a third inverter and the output of an adjacent fourth inverter, and said second device is operated to apply third and fourth test bits as input test signals to said third inverter input.

5. The method of claim 4, wherein:
said first and second test device are responsive to respectively corresponding select signals to provide test bits comprising logic 1's or logic 0's, selectively.

6. The method of claim 1 wherein:
said method further comprises coupling said ring oscillator output to a sample register, wherein said ring oscillator output comprises the respective responses to collectively no more than 4 test bits, and said oscillator output is used to confirm the logic functionality and electrical continuity of each of said inverters of said ring oscillator, and of all connections therebetween.

7. Apparatus for testing functionality in a ring oscillator that comprises an odd number of inverters connected to form a closed loop, each inverter having an input and an output wherein the output of an inverter is connected to the input of the next inverter in the loop, said apparatus comprising:
a first test device inserted between the input of a first inverter mid the output of an adjacent second inverter for applying first and second test bits as input test signals to said first inverter input;
a second test device connected to said ring oscillator for providing further test bits for use in detecting functionality of said first test device; and
a processing device for receiving and selectively processing responses to said first, second and further test bits, to provide an evaluation of the functionality of said ring oscillator.

8. The apparatus of claim 7, wherein:
a third test device is connected to receive said responses to said first and second test bits as a first input, and to receive responses to said further test bits as a second input, said first and second inputs to said third device collectively comprising a ring oscillator output that is sent to said processing device for use in providing said evaluation of the functionality of said ring oscillator.

9. The apparatus of claim 8, wherein:
said first, second and third test devices are respectively included in said ring oscillator as integral components thereof.

10. The apparatus of claim 9, wherein:
said first and second test devices are responsive to respectively corresponding select signals to provide test bits comprising logic 1's or logic 0's, selectively.

11. The apparatus of claim 10, wherein:
said second test device is inserted between the input of a third inverter and the output of an adjacent fourth inverter, and said second device is operated to apply third and fourth test bits as input test signals to said third inverter input.

12. The apparatus of claim 8, wherein:
a sample register is coupled to receive said ring oscillator output from said third test device, wherein said oscillator output comprises, collectively, the responses to no more than four of said test bits.

13. A computer program product in a computer readable medium for testing functionality in a ring oscillator that comprises an odd number of inverters connected to form a closed loop, each inverter having an input and output wherein the output of an inverter is connected to the input of the next inverter in the loop, said computer program product comprising:
first instructions for operating a first test device inserted between the input of a first inverter and the output of an adjacent second inverter to apply first and second test bits as input test signals to said first inverter input;
second instructions for operating a second test device connected to said ring oscillator to provide further test bits for use in detecting functionality of said first test device; and
third instructions for operating a processor to receive respective responses to said first, second and further test bits, and to selectively process said received responses to provide an evaluation of the functionality of said ring oscillator.

14. The computer program product of claim 13, wherein:
a third test device is connected to receive said responses to said first and second test bits as a first input, to receive responses to said further test bits as a second input, and to furnish said first and second inputs as a ring oscillator output to said processor.

15. The computer program product of claim 14, wherein:
said first, second and third test devices are respectively connected to said ring oscillator as integral components thereof.

16. The computer program product of claim 15, wherein:
said computer program product further comprises a fourth instruction to operate said processing device to supply corresponding select signals to said first, second and third test devices, to respectively control operation thereof.

17. The computer program product of claim 16, wherein:
said second test device is inserted between the input of a third inverter and the output of an adjacent fourth inverter, and said second device is operated to apply third and fourth test bits as input test signals to said third inverter input, said first, second, third and fourth test bits, collectively, being sufficient to confirm logic functionality and electrical continuity of respective components of said ring oscillator.

18. The computer program product of claim 14, wherein:
a sample register is connected to said third test device to receive said first and second inputs, and to furnish said ring oscillator output to said processing device.

* * * * *